(12) United States Patent
Falkenberg et al.

(10) Patent No.: US 6,690,312 B1
(45) Date of Patent: Feb. 10, 2004

(54) METHOD AND CIRCUIT FOR REGULATING THE SIGNAL LEVEL FED TO AN ANALOG/DIGITAL CONVERTER

(75) Inventors: Andreas Falkenberg, Escondido, CA (US); Ulf Niemeyer, Bochum (DE); Christoph Rohe, Herne (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/959,231
(22) PCT Filed: Apr. 20, 2000
(86) PCT No.: PCT/DE00/01249
§ 371 (c)(1), (2), (4) Date: Dec. 11, 2001
(87) PCT Pub. No.: WO00/65721
PCT Pub. Date: Nov. 2, 2000

(30) Foreign Application Priority Data

Apr. 22, 1999 (DE) .......................... 199 18 385

(51) Int. Cl.$^7$ .............................. H03M 1/66
(52) U.S. Cl. ........................... 341/144; 341/139
(58) Field of Search ............... 341/144, 118, 341/120

(56) References Cited

U.S. PATENT DOCUMENTS

| 4,574,246 A | 3/1986 | Yoshida | |
| 4,860,010 A | 8/1989 | Iwamatsu | |
| 5,821,889 A * | 10/1998 | Miller | 341/139 |
| 6,259,391 B1 * | 7/2001 | Pakravan et al. | 341/139 |
| 6,288,658 B1 * | 9/2001 | Mestdagh et al. | 341/118 |

FOREIGN PATENT DOCUMENTS

| DE | 4319376 C1 | 8/1994 |
| DE | 19626599 A1 | 1/1998 |
| EP | 0757447 A2 | 2/1997 |

OTHER PUBLICATIONS

Patent Abstracts of Japan, Publication No. 03243077, published Oct. 30, 1991.

Patent Abstracts of Japan, Publication No. 63190456, published Aug. 8, 1988.

* cited by examiner

Primary Examiner—Peguy JeanPierre
Assistant Examiner—Joseph Lauture
(74) Attorney, Agent, or Firm—Staas & Halsey LLP

(57) ABSTRACT

For regulating the signal level fed to an analog/digital converter, the rate of change at which the output signal of the analog/digital converter changes over time, in particular the rate of change of an output bit of the analog/digital converter, is measured and compared with a setpoint value, in order to set the signal level fed to the analog/digital converter based on the comparison.

32 Claims, 2 Drawing Sheets

METHOD AND CIRCUIT FOR REGULATING THE SIGNAL LEVEL FED TO AN ANALOG/DIGITAL CONVERTER

CROSS REFERENCE TO RELATED APPLICATIONS

This application is based on and hereby claims priority to PCT Application No. PCT/DE00/01249 filed on Apr. 20, 2000 and German Application No. 199 18 385.6 filed Apr. 22, 1999 in Germany, the contents of which are hereby incorporated by reference.

BACKGROUND OF THE INVENTION

The present invention relates to a method and a circuit arrangement for regulating the signal level fed to an analog/digital converter.

According to the current state of the art, radio-frequency receivers (RF receivers) operate in analog mode in the RF receiving part. A received signal is only digitized after it has been mixed down into the baseband or an intermediate frequency. Since the RF input range may be very great on account of the different distances from the transmitter, the received signal must be normalized before further processing, in particular before its digitization. For this purpose, what are known as AGC (Automatic Gain Control) circuits are used, the task of which is to regulate the signal level fed to the analog/digital converter (A/D converter), provided in the receiver for digitization, in such a way that the A/D converter is not overloaded. Since the AGC circuit cannot operate at a rate allowing for the fast-fading effects occurring in the mobile radio sector, a safety reserve must be provided between the setpoint value assigned to the AGC circuit and the maximum value which can be converted by the A/D converter, so that the signal to be converted covers the entire operating range of the A/D converter minus the safety reserve. The safety reserve should be set to a margin allowing compensation for brief received signal peaks within the time constant of the controller used in the AGC circuit. Depending on the application, for example in the case of cordless digital telephones, the safety reserve may be 75% of the workable control range of the A/D converter, it being possible to accept a brief overloading of the A/D converter.

Both AGC circuits upstream of the A/D converter and AGC circuits downstream of the A/D converter are known variants. AGC circuits which are arranged downstream of the A/D converter have the advantage that no adjustment has to be carried out between the input level of the A/D converter and the input level of the AGC circuit.

DE 43 19 376 C1 discloses a method and a circuit arrangement for the analog/digital conversion of signals with different signal levels, in which the output signal of the analog/digital converter is monitored by a logical circuit module which is connected to the output of the analog/digital converter and in which the signal level fed to the analog/digital converter is set by the logical circuit module in dependence on the result of the monitoring in such a way that the signal level of the output signal remains within a certain range.

In FIG. 4, an example of an RF receiver with a known AGC circuit arranged downstream of the A/D converter is represented. A received or input signal is fed to the RF receiving part 2 of the RF receiver via an antenna 1. As already mentioned, the RF receiving part 2 operates in analog mode. The analog received signal is therefore fed for digitization to an A/D converter 4, the input signal level of which is regulated by a closed-loop control circuit, the closed-loop control circuit comprising a variable-gain amplifier 3, which is arranged between the RF receiving part 2 and the A/D converter 4. The A/D converter 4 shown in FIG. 4 is an 8-bit A/D converter, the 8-bit output value of which is fed to a unit 5, which calculates the absolute value of the signal value supplied by the A/D converter. The absolute value determined in this way is fed with a negative algebraic sign to an adder 6, which also receives a setpoint assignment SP, so that with the aid of the adder 6 the setpoint value SP is compared with the calculated absolute value and, in dependence on the result of the comparison, an adjustment signal for the amplifier 3 is generated, the adjustment signal being generated according to FIG. 4 by combination of two subsignals with the aid of an adder 9. The first subsignal is supplied by a unit 7, which integrates and scales the differential signal fed to it, while the second subsignal is supplied by a low-pass filter of the first order (LP) 8, which likewise additionally scales the differential signal fed to it. The unit 7 consequently represents the integral-action component of a PI controller, while the unit 8 represents the proportional-action component of the PI controller. With the aid of the closed-loop control circuit formed in this way, the input gain of the A/D converter 4 is regulated in such a way that the absolute value of the output signal of the A/D converter 4 always remains within a certain range, or approaches the setpoint value SP within a certain time.

SUMMARY OF THE INVENTION

One aspect of the present invention is based on the object of providing a novel method and a novel circuit arrangement for regulating the signal level fed to an analog/digital converter, it being intended for this method and circuit arrangement to make it possible for the signal level fed to the analog/digital converter to be regulated in the simplest way possible. In particular, the circuit arrangement is intended to require only a minimal number of components.

One aspect of the invention is based on the premise that the received signal in digital radio systems, such as for example in CDMA (Code Division Multiple Access) systems, is to correspond over time to a certain random distribution, irrespective of the information. Therefore, it is presumed that it is adequate to arrange the regulating of the signal level fed to the A/D converter in such a way, that, over a certain period of time, only a certain number of output signals of the A/D converter lie above a certain normalized signal level. This can be monitored by measuring the probability of change or the rate of change of the output signal of the A/D converter.

In particular, it is assumed that it is adequate to regulate the probability with which the information of a certain bit of the output signal of the A/D converter changes in such a way that it always lies within a certain range and does not exceed a predetermined limit value. This is possible since the output bits of the A/D converter correspond to certain thresholds, which occur more often with the modulo factor of their significance. For this purpose, one of the more-significant bits of the output signal of the A/D converter is advantageously monitored.

The probability with which the monitored output signal of the A/D converter changes must be less than 50%. The stability of the system is all the better, however, the smaller this limit value is. If, however, the limit value is chosen to be too small, under some circumstances not all the bits of the A/D converter are used and consequently system resources are wasted. A limit value of 25% has been found to be advantageous, since this value, represents a good compromise between the requirements mentioned above. This limit value is therefore advantageously used as the set point assignment for the regulating of the input signal level of the A/D converter, i.e. the input signal level of the A/D converter is regulated in such a way that the monitored output bit of the A/D converter is changed on average over time at most with a probability of 25%, i.e. every four sampled values. In the case of an 8-bit A/D converter, for example, the probability of change or rate of change of the sixth bit can consequently be regulated on the basis of 25%.

The principle described above makes it possible to construct an AGC circuit with a minimal number of components, which are moreover inexpensive. This results from the fact that regulating is not based on a specific output value of the A/D converter, but on the rate of change or probability of change of the A/D converter. The AGC circuit may be constructed in particular in such a way that it relates the change of the output signal of the A/D converter, in particular the change of a certain output bit, to the progression of time. If a small rate of change is measured in this way, the input gain of the A/D converter is increased by a corresponding regulating circuit, or in the other case it is reduced.

BRIEF DESCRIPTION OF THE DRAWINGS.

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Figure 1:
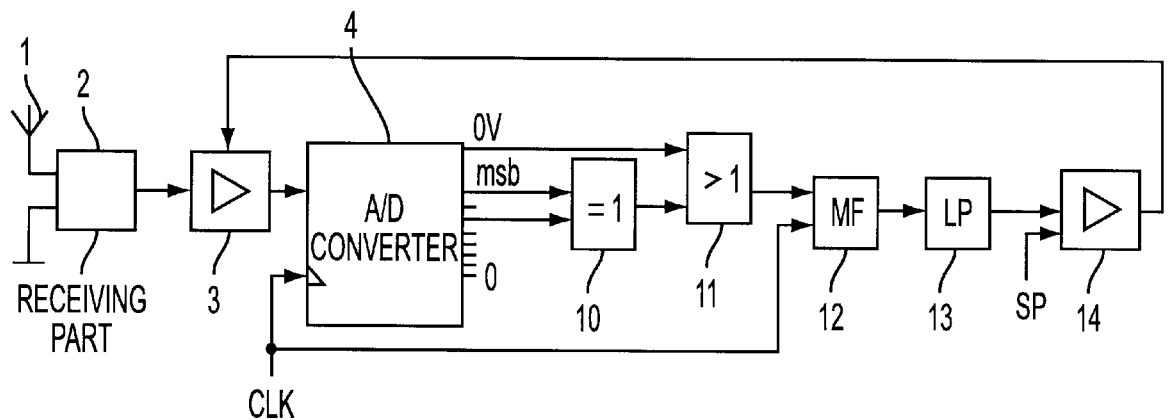
FIG. 1 shows a radio-frequency receiver with an AGC circuit according to a first exemplary embodiment of the present invention.

Reference will now be made in detail to the preferred embodiments of the present invention, examples of which are illustrated in the accompanying drawings, wherein like reference numerals refer to like elements throughout.

According to FIG. 1, the receiver represented again comprises an RF receiving part 2, to which an RF received signal is fed via an antenna 1. The RF receiving part 2 operates in analog mode and mixes the received signal into the baseband, the baseband signal supplied by the RF receiving part 2 being fed to an A/D converter 4, which converts this signal into a digital data sequence. The gain factor of an input amplifier 3 arranged upstream of the A/D converter 4 is variable and is set by a PI controller 14 in such a way that an optimum signal level is present at the input of the A/D converter 4.

In the following text it is assumed that a signal level which corresponds to ¼, i.e. 25%, of the maximum signal level is regarded as the optimum signal level. The safety reserve of 75% consequently used should be adequate to compensate for the signal peaks caused by fast-fading effects. In this case, the rate of change of the second bit below the most-significant bit (msb) can be monitored in order to ensure observance of the 25% threshold of the input signal level of the A/D converter 4. The rate of change of the second bit below the most-significant bit, i.e. in the case of an 8-bit A/D converter of bit No. 5, for the case of an input signal level which corresponds to 25% of the maximum signal level is therefore used as the setpoint assignment SP and is fed to the PI controller 14.

The rate of change of the corresponding bit of the output signal of the A/D converter 4 is monitored according to FIG. 1 by a logic circuit, which, independence on the switching times of the monitored bit supplies corresponding pulses. This logic circuit comprises an XOR gate 10, which compares the status of the monitored bit with that of the most-significant bit and supplies the output value "1" if the most-significant bit or the sign bit and the monitored bit differ. Furthermore, the logic circuit comprises an OR gate 11 downstream of the XOR gate 10, said OR gate only being required, however, if an A/D converter 4 with a clipping function is used, in which case the A/D converter 4 outputs a certain maximum value, defined by its word width, if the input value is greater than the maximum value. The OR gate 11 receives as input signals a control signal OV, which in the clipping case has the value "1", and the output signal of the XOR gate 10.

Arranged downstream of the OR gate 11 is a one-shot multivibrator 12, which is set to be synchronous with the point in time at which the upstream logic senses an item of information on the bit of interest. This is achieved by the AND converter 4 and the one-shot multivibrator 12 being triggered by the same clock signal CLK. The one-shot multivibrator 12 generates a pulse of constant duration each time the monitored bit contains an item of information, i.e. has the value "1", the pulse duration being shorter than the duration of a sampling period.

The output signal of the one-shot multivibrator 12 is fed to a low-pass filter 13 of the first or a higher order, which produces the mean time value of the pulse sequence applied to it and consequently generates an output signal which is proportional to the mean number of the last pulses. The time constant of the low-pass filter should correspond to the length of a time slot of the received signal or a multiple (≧10) of the sampling rate of the A/D converter 4.

The actual-value signal produced in this way for the rate of change of the sixth bit, i.e. the output bit No. 5, of the A/D converter 4 is fed to the already mentioned PI controller 14, which compares the actual rate of change, indicated by the actual-value signal, of the monitored bit with the predetermined setpoint value SP and, in dependence on the difference, generates a setting signal for the input amplifier 3 in such a way that the input gain is increased if the mean pulse value lies below the setpoint value SP, while the input gain is reduced if the mean pulse value lies above the setpoint value SP.

The output signal of the PI controller 14 can be converted into a digital AGC signal for any desired microcontroller with the aid of a further A/D converter, which operates at a low sampling rate.

The circuit variant shown in FIG. 1 is a design with an analog PI control circuit. To avoid the disadvantages associated with analog components with regard to the maintenance of tolerances and circuit drift, the circuit variant shown in FIG. 2 with digital components may be used. To simplify the circuit, the PI controller has been replaced by an I controller.

Figure 2:
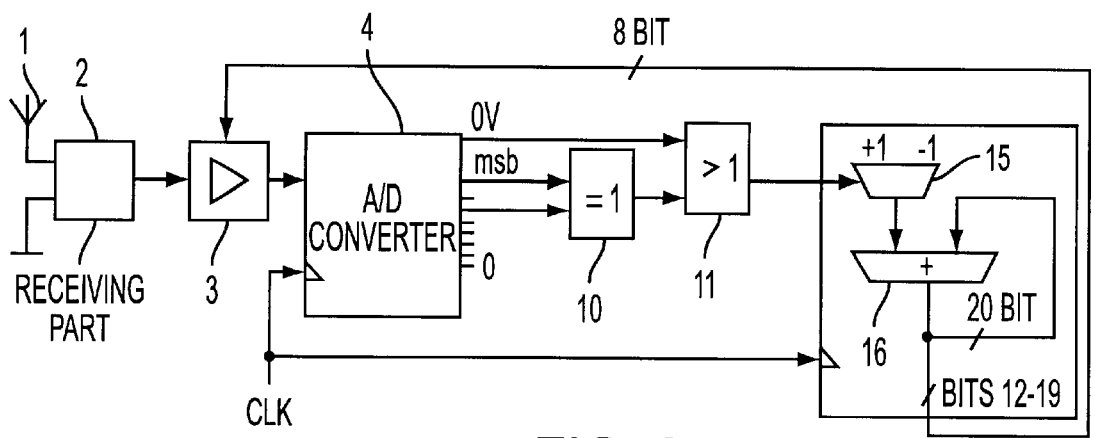
FIG. 2 shows a radio-frequency receiver with an AGC circuit according to a second exemplary embodiment of the present invention.

According to FIG. 2, the analog portion shown in FIG. 1 with the one-shot multivibrator 12, the low-pass filter 13 and the PI controller 14 is replaced by a corresponding equivalent circuit with a multiplexer 15 and an accumulator 16 or an adder with a feedback output. The accumulator 16 is in this case a 20-bit accumulator. The size of the accumulator 16 is set such that no overflow occurs within the time constant of the closed-loop control circuit.

Fixed values "+1" and "−1" are present at the inputs of the multiplexer 15. The multiplexer. 15 is driven by the output signal of the OR gate 11 in such a way that it switches through the value "−1" to its output if the logic circuit with the XOR gate 10 and the OR gate 11 has detected an item of information, i.e. the value "1", on the monitored bit, whereas in the other case the value "+1" is switched through. The output value of the multiplexer 15 is fed to the accumulator or adder 16, which preferably has internally a logic circuit to avoid overflowing. The accumulated output value of the accumulator 16 is used for generating the setting signal for the input amplifier 3, the upper eight bits of the output value of the accumulator 16 in particular being fed to the input amplifier 3 for this purpose.

Figure 3:
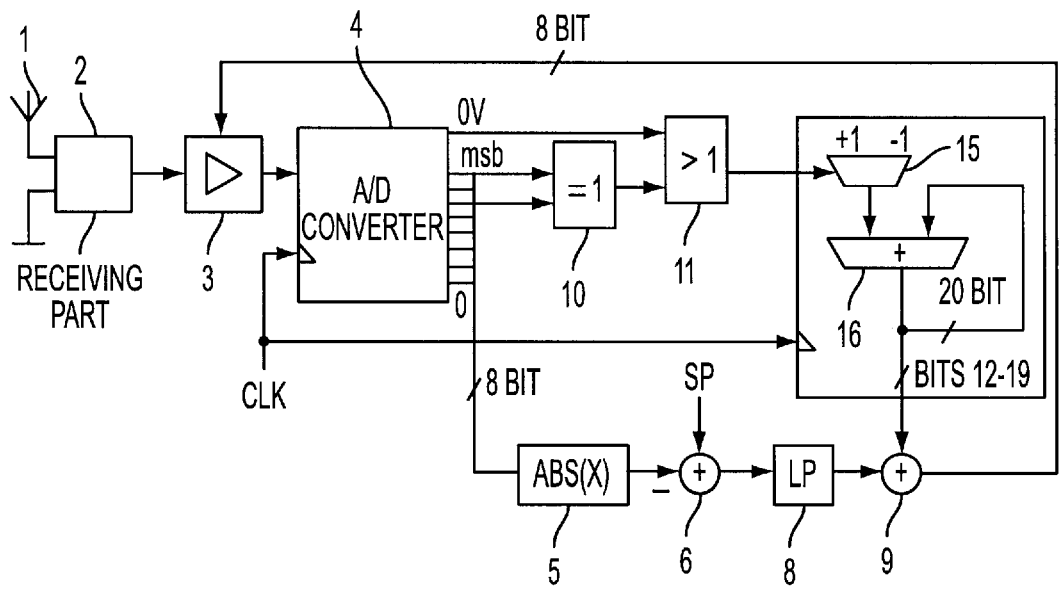
FIG. 3 shows a radio-frequency receiver with an AGC circuit according to a third exemplary embodiment of the present invention, and, FIG. 4 shows a radio-frequency receiver with an AGC circuit according to the prior art.
Figure 4:
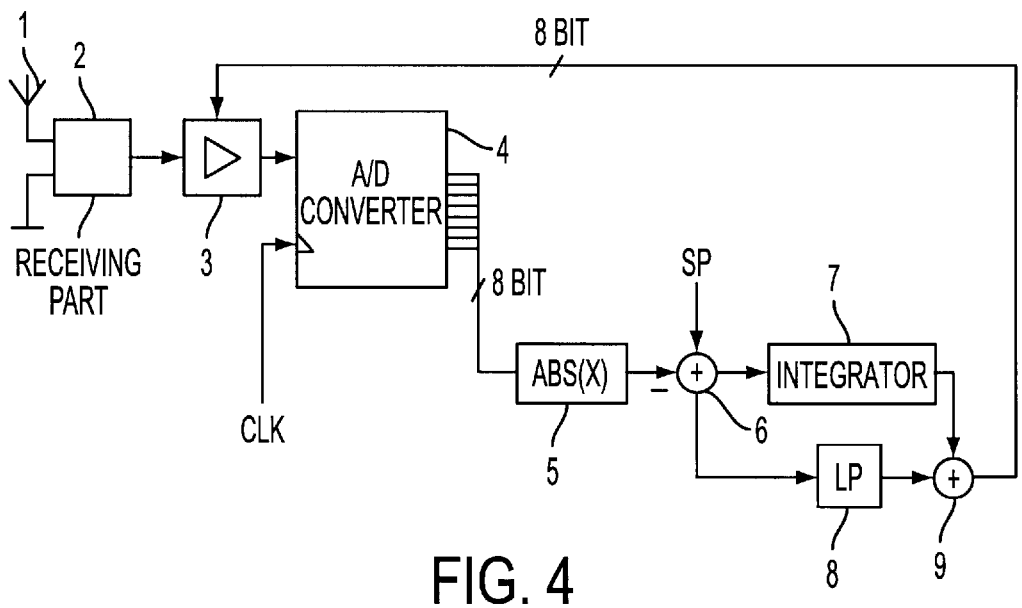

In the case of the exemplary embodiment shown in FIG. 2, the closed-loop control circuit is only provided with an integral-action component. To add the proportional-action component to the closed-loop control circuit, the circuit shown in FIG. 2 can be extended in a way analogous to the circuit shown in FIG. 4 by a portion which monitors all the output bits of the A/D converter 4 and from this calculates the absolute value and compares it with the assigned setpoint value SP. The differential value determined in this way can in turn be fed to a digital low-pass filter of the first order and scaled and the result scaled in this way can be added to the integral-action component of the accumulator 16. A corresponding circuit is shown in FIG. 3, the components corresponding to the circuit represented in FIG. 4 being provided with the same designations. Instead of forming the absolute value by the unit 5, the output signal of the A/D converter 4 may also be squared.

The invention has been described in detail with particular reference to preferred embodiments thereof and examples, but it will be understood that variations and modifications can be effected within the spirit and scope of the invention.

What is claimed is:

1. A method to regulate a signal level fed to an analog/digital converter, using a regulating circuit having a multiplexer and an accumulator, the accumulator having a counter, comprising:

monitoring an output signal of the analog/digital converter and measuring a rate of change of the output signal;

setting the signal level fed to the analog/digital converter based on a result of the monitoring and based on the rate of change where the signal level of the output signal remains within a certain range;

measuring an average of the rate of change over time of a bit of the output signal;

measuring a change of the bit with respect to a most-significant bit of the output signal;

applying fixed values +1 and −1 to the multiplexer as input values, which are selectively switched through to the output of the multiplexer, based on the measured change of the bit;

receiving, at the accumulator, the input values selectively switched through the multiplexer;

changing the counter in a way corresponding to the input values; and generating the setting signal based on the counter reading.

2. The method as claimed in claim 1, wherein the signal level fed to the analog/digital converter is set based on a comparison of the rate of change with a setpoint rate of change.

3. The method as claimed in claim 2, wherein, in the setting of the signal level, a mean probability of change of <50% is chosen as the setpoint value for the rate of change of the monitored bit of the output signal of the analog/digital converter, so that the signal level fed to the analog/digital converter is regulated in such a way that the monitored bit of the output signal of the analog/digital converter changes on average at most with every second clock cycle of the analog/digital converter.

4. The method as claimed in claim 3 wherein, in the setting of the signal level, a mean probability of change of 25% is chosen as the setpoint value for the rate of change of the monitored bit of the output signal of the analog/digital converter, so that the signal level fed to the analog/digital converter is regulated in such a way that the monitored bit of the output signal of the analog/digital converter changes on average every four clock cycles of the analog/digital converter.

5. The method as claimed in claim 4, wherein the analog/digital converter supplies an 8-bit output signal, and in the monitoring of the output signal, the rate of change of a sixth bit of the output signal of the analog/digital converter is measured.

6. The method as claimed in claim 4, wherein, in the monitoring of the output signal, the rate of change of the more-significant bit of the output signal of the analog/digital converter is measured.

7. The method as claimed in claim 6, wherein the analog/digital converter supplies an 8-bit output signal, and in the monitoring of the output signal, the rate of change of a sixth bit of the output signal of the analog/digital converter is measured.

8. The method as claimed in claim 7, wherein in the setting of the signal level, the signal level fed to the analog/digital converter is increased if the rate of change measured in the monitoring of the output signal is less than the setpoint value, and in the setting of the signal level, the signal level fed to the analog/digital converter is reduced if the rate of change measured in the monitoring of the output signal is greater than the setpoint value.

9. The method as claimed in claim 2, wherein in the setting of the signal level, the signal level fed to the analog/digital converter is increased when the rate of change measured in the monitoring of the output signal is less than the setpoint value, and in the setting of the signal level, the signal level fed to the analog/digital converter is reduced when the rate of change measured in the monitoring of the output signal is greater than the setpoint value.

10. The method as claimed in claim 3, wherein, in the monitoring of the output signal, the rate of change of the most-significant bit of the output signal of the analog/digital converter is measured.

11. A circuit arrangement for regulating the signal level fed to an analog/digital converter, comprising:

an amplifier to feed to the analog/digital converter an analog input signal with a certain signal level;

a monitor to monitor an output signal of the analog/digital converter, to measure a rate of change at which the output signal of the analog/digital converter changes over time, and to measure an average of the rate of change over time of a bit of the output signal of the analog/digital converter; and a regulating circuit to generate a setting signal for the amplifier, the regulating circuit generating the setting signal for the amplifier based on the monitoring result of the monitor and the rate of change measured by the monitor so that the signal level fed to the analog/digital converter remains within a certain range, wherein the monitor comprises a logic circuit, which measures a change of the bit with respect to a most-significant bit of the output signal of the analog/digital converter and outputs a signal indicative thereof, the regulating circuit comprises a multiplexer, driven by an output signal of the logic circuit, and an accumulator having a counter, where fixed values +1 and −1 are applied to the multiplexer as input values, which are selectively switched through to the output of the multiplexer, based on the signal output from the logic circuit, and the accumulator receives the input values selectively switched through the multiplexer, changes its counter reading in a way corresponding to the input values and, based on the counter reading, generates the setting signal for the amplifier.

12. The circuit arrangement as claimed in claim 11, wherein the monitor measures the average rate of change over time of a more-significant bit of the output signal of the analog/digital converter.

13. The circuit arrangement as claimed in claim 12, wherein the analog/digital converter supplies an 8-bit output signal, and the monitor measures the average rate of change over time of a sixth bit of the output signal of the analog/digital converter.

14. The circuit arrangement as claimed in claim 11, wherein the analog/digital converter supplies an 8-bit output signal, and the monitor measures the average rate of change over time of a sixth bit of the output signal of the analog/digital converter.

15. The circuit arrangement as claimed in claim 11, wherein the logic circuit comprises an XOR gate, which is fed as input signals the monitored bit and the most-significant bit of the output signal of the analog/digital converter.

16. The circuit arrangement as claimed in claim 15, wherein the logic circuit further comprises an OR gate to which the output signal of the XOR gate is fed as input signal and an overflow signal of the analog/digital converter.

17. The circuit arrangement as claimed in claim 16 wherein the monitor comprises a mean-value-forming circuit to form the mean time value of the rate of change, measured by the logic circuit, of the monitored bit of the output signal of the analog/digital converter.

18. The circuit arrangement as claimed in claim 11, wherein the monitor comprises a mean-value-forming circuit to form a mean time value of the rate of change of the monitored bit of the output signal of the analog/digital converter.

19. The circuit arrangement as claimed in claim 18, wherein the mean-value-forming circuit comprises a one-shot multivibrator and a low-pass filter arranged in series, the one-shot multivibrator being connected to the logic circuit and timed with the same clock as the analog/digital converter.

20. The circuit arrangement as claimed in claim 19, wherein the regulating circuit comprises a PI controller, which compares the rate of change measured by the monitor with a setpoint value and, based on a deviation between the rate of change measured by the monitor and the setpoint value, generates the setting signal for the amplifier.

21. The circuit arrangement as claimed in claim 11, wherein the regulating circuit comprises a PI controller, which compares the rate of change measured by the monitor with a setpoint value and, based on a deviation between the rate of change measured by the monitor and the setpoint value, generates the setting signal for the amplifier.

22. The circuit arrangement as claimed in claim 21, wherein the PI controller generates a setting signal for the amplifier increasing the signal level fed to the analog/digital converter if the rate of change measured by the monitor is less than the setpoint value, and the PI controller generates a setting signal for the amplifier reducing the signal level fed to the analog/digital converter if the rate of change measured by the monitor is greater than the setpoint value.

23. The circuit arrangement as claimed in claim 22, wherein a mean probability of change of <50% is chosen as the setpoint value for the rate of change of the monitored bit of the output signal of the analog/digital converter, so that the signal level fed to the analog/digital converter is regulated in such a way by the regulating circuit that the monitored bit of the output signal of the analog/digital converter changes on average at most with every second clock cycle of the analog/digital converter.

24. The circuit arrangement as claimed in claim 23, wherein a mean probability of change of 25% is chosen as the setpoint value for the rate of change of the monitored bit of the output signal, of the analog/digital converter, so that the signal level fed to the analog/digital converter is regulated by the regulating circuit in such a way that the monitored bit of the output signal of the analog/digital converter changes on average every four clock cycles of the analog/digital converter.

25. The use of a circuit arrangement as claimed in claim 24 in a radio-frequency receiver, a received signal received by a radio-frequency receiving unit and mixed down to a baseband signal being fed to the analog/digital converter for conversion into a digital signal via the amplifier of the circuit arrangement.

26. The circuit arrangement as claimed in claim 11, wherein the accumulator is a 20-bit accumulator, the upper eight bits of the counter reading of the accumulator being fed as the setting signal to the amplifier.

27. The circuit arrangement as claimed in claim 26, wherein an absolute-value forming unit is connected to the output of the analog/digital converter, in order to form the absolute value of the output signal of the analog/digital converter, a comparator is connected to the output of the absolute-value-forming unit, in order to compare the absolute value supplied by the absolute-value forming unit with a setpoint value, and an adder is provided for adding the output signal of the comparator and the output signal of the accumulator, the result of the addition of the adder being fed as the setting signal to the amplifier.

28. The circuit arrangement as claimed in claim 26, wherein a mean probability of change of <50% is chosen as the setpoint value for the rate of change of the monitored bit of the output signal of the analog/digital converter, so that the signal level fed to the analog/digital converter is regulated in such a way by the regulating circuit that the monitored bit of the output signal of the analog/digital converter changes on average at most with every second clock cycle of the analog/digital converter.

29. The circuit arrangement as claimed in claim 11, wherein
   an absolute-value forming unit is connected to the output of the analog/digital converter, in order to form the absolute value of the output signal of the analog/digital converter,
   a comparator is connected to the output of the absolute-value forming unit, in order to compare the absolute value supplied by the absolute-value forming unit with a setpoint value, and
   an adder is provided for adding the output signal of the comparator and the output signal of the accumulator, the result of the addition of the adder being fed as the setting signal to the amplifier.

30. The circuit arrangement as claimed in claim 29, wherein the output signal of the comparator is fed to the adder via a low-pass filter.

31. The use of a circuit arrangement as claimed in claim 11 in a radio-frequency receiver, a received signal received by a radio-frequency receiving unit and mixed down to a baseband signal being fed to the analog/digital converter for conversion into a digital signal via the amplifier of the circuit arrangement.

32. A method to regulate a signal level of an input to an analog/digital converter, using a regulating circuit having a multiplexer and an accumulator, the accumulator having a counter reading, comprising:
   monitoring an output signal from the analog/digital converter;
   measuring a rate of change of a selected bit of the output signal;
   determining an average rate of change over time of the selected bit;
   determining a change of the average rate of change of the selected bit with respect to a most-significant bit of the output signal and producing a result;
   applying fixed values +1 and −1 to the multiplexer as input values;
   selectively switching the input values through the multiplexer, based on the result;
   receiving at the accumulator the input values selectively switched through to the output of the multiplexer;
   changing the counter reading of the accumulator in a way corresponding to the input values; and
   generating a setting signal based on the counter reading; and
   setting the signal level of the input to the analog/digital converter based on the setting signal so as that a level of the output signal remains within a certain range.

* * * * *